United States Patent [19]

Davies, Jr.

[11] Patent Number: 4,481,432
[45] Date of Patent: Nov. 6, 1984

[54] PROGRAMMABLE OUTPUT BUFFER

[75] Inventor: Thomas J. Davies, Jr., Gilroy, Calif.

[73] Assignee: Fairchild Camera & Instrument Corp., Mountain View, Calif.

[21] Appl. No.: 386,125

[22] Filed: Jun. 7, 1982

[51] Int. Cl.³ .................. H03K 19/094; H03K 19/20; H03K 17/687
[52] U.S. Cl. .................. 307/469; 307/451; 307/579; 307/585; 307/270
[58] Field of Search ............. 307/443, 450, 451, 468, 307/469, 475, 576, 579, 585, 270; 357/42

[56] References Cited

U.S. PATENT DOCUMENTS

| | | | |
|---|---|---|---|
| 3,651,340 | 3/1972 | Cliff | 307/451 |
| 4,069,430 | 1/1978 | Masuda | 307/450 X |
| 4,084,105 | 4/1978 | Teranishi et al. | 307/468 X |
| 4,209,713 | 6/1980 | Satou et al. | 307/451 X |
| 4,223,277 | 9/1980 | Taylor et al. | 330/264 |
| 4,274,014 | 6/1981 | Sebade, Jr. | 307/451 X |
| 4,327,368 | 4/1982 | Uehida | 357/42 |
| 4,384,220 | 5/1983 | Segawa et al. | 307/468 X |

OTHER PUBLICATIONS

Krick, "Complementary MNOS Electronically Alternable Read-Only Memory", *IBM T.D.B.*, vol. 13, No. 1, 6-1970, pp. 263-264.

Primary Examiner—Larry N. Anagnos
Assistant Examiner—David R. Hudspeth
Attorney, Agent, or Firm—Kenneth Olsen; Carl L. Silverman; Alan H. MacPherson

[57] ABSTRACT

A structure and method are provided wherein a single output buffer stage (50) is provided which can be programmed to function either as an open drain output buffer or a CMOS Push-Pull output buffer. The output buffer stage constructed in accordance with this invention is programmed in one of several manners. In one embodiment of this invention, the fabrication steps utilized to program the output buffer are the enhancement and depletion dopings, whereby certain devices of the output buffer are programmed to either remain always turned off or always turned on, thus programming the output buffer to serve either as an open drain output buffer or as a CMOS push-pull output buffer.

3 Claims, 8 Drawing Figures

PROGRAMMABLE OUTPUT BUFFER

BACKGROUND OF THE INVENTION

This invention relates to electronic circuits and more particularly to output stages utilized in integrated circuit devices.

Integrated circuits are well known in the prior art. Integrated circuits typically comprise a large number of components formed in a single, monolithic block of semiconductor material which are generally designed to operate using a minimum amount of power. In order to provide input signals to these low power devices, input buffers are commonly used. Similarly, in order to derive output signals suitable for driving external circuitry, output buffers are used to buffer the low-voltage low-power signals generated by the integrated circuit device. Typically these output buffer devices are formed in the same semiconductor substrate as the remaining portions of the integrated circuit device.

One such output buffer stage, often referred to as the "open drain" buffer, is shown schematically in FIG. 1a. The open drain output buffer comprises, in this example, N channel metal oxide silicon (MOS) transistor 16, having its source 13 grounded, its control gate 11 connected to a low power driving signal, and its drain 12 connected to output terminal 12 of the integrated circuit device. In this manner a high voltage (logical 1) signal applied to gate 11 causes N channel transistor 16 to turn on, thus causing output terminal 12 to be grounded, which in turn causes current to flow through load device $R_L$ from voltage source V to terminal 12 to ground. Conversely, a low voltage (i.e. logical 0) applied to control gate 11 causes transistor 16 to turn off, thus causing output terminal 12 to be open. Parasitic diodes 19 and 15 (i.e. diodes which are inherently formed when forming transistor 16) are connected between ground and the drain and source, respectively, of MOS transistor 16. In the open drain configuration, parasitic diode 15 has both its cathode and its anode connected to ground, and thus is unimportant. Furthermore, in the open drain configuration, parasitic diode 19 is reverse-biased in that terminal 12 will be either open or connected to a positive voltage. A cross-sectional view of the structure of FIG. 1a is shown in FIG. 1b, with components numbered in a similar manner as in FIG. 1a. Thus in FIG. 1b, transistor 16 comprises P type substrate 14, N type source 13, N type drain 12, field oxide region 98, gate insulation region 99, and control gate 11. Parasitic diode 15 is formed by the PN junction formed between P type substrate 14 and N type source 13. Similarly, parasitic diode 19 is formed by the PN junction formed between P type substrate 14 and N type drain 12.

Another type of prior art output buffer is shown in the schematic diagram of FIG. 2a. Output buffer 20 is often referred to as the "CMOS Push-Pull" output stage, due to its use of complementary P channel and N channel transistors 22, 23, respectively. The source of P channel transistor 22 is connected to a positive voltage source V applied to terminal 21. The drain of P channel transistor 22 is connected to the drain of N channel transistor 23, and output terminal 12 is connected therebetween. The source of N channel transistor 23 is connected to ground. The gate 11a of transistor 22 and the gate 11b of transistor 23 are connected in common to terminal 11 which receives the input signal to be buffered by CMOS Push-Pull buffer stage 20. When a logical 0 (low voltage) signal is applied to terminal 11, P channel transistor 22 turns on and N channel transistor 23 turns off, thus connecting output terminal 12 to terminal 21, thus providing a voltage substantially equal to V on output terminal 12. Conversely, with a logical 1 (high voltage) signal applied to terminal 11, P channel transistor 22 turns off and N channel transistor 23 turns on, thus grounding output terminal 12 through transistor 23. Parasitic diodes 24 and 25 are formed between the source and the drain of P channel transistor 22 and the voltage source V. Similarly, parasitic diodes 26 and 27 are formed as shown between the drain and the source of N channel transistor 23 and ground.

A cross-sectional view of the structure of FIG. 2a is shown in FIG. 2b with corresponding regions labelled with corresponding numbers. Thus, N type substrate 14 is connected to V and P type well region 81 is formed within substrate 14. P type well region 81 is connected to ground. Within N type substrate 14 is formed P channel transistor 22 having its source connected to terminal 21, its drain connected to terminal 12, and its control gate 11a connected to terminal 11. The parasitic diodes 24 and 25 (FIG. 2a) are formed by the PN junctions formed between the source and the drain of transistor 22 and N type substrate 14. Similarly, N channel transistor 23 is formed in P type well 81 as shown. N channel transistor 23 has its source 39 grounded, its drain connected to terminal 12 and its gate 11b connected to terminal 11. N channel transistor 23 has its parasitic diodes 26 and 27 formed by the PN junctions formed between P well 81 and the N type drain and source regions of transistor 23, respectively.

Referring again to FIG. 2a, it is often desirable when utilizing a CMOS output buffer to utilize an external pull-up resistor 95 connected between output terminal 12 and a positive voltage supply connected to terminal 93. With a logical 1 applied to terminal 11, P channel transistor 22 turns off, N channel transistor 23 turns on, and the voltage on terminal 12 is substantially ground, as desired. Conversely, when, as shown in FIG. 2a, the voltage applied to terminal 93 is greater than $(V+V_D)$, where $V_D$ is equal to the voltage required to forward-bias a PN diode, parasitic diode 25 will be forward-biased and the voltage on terminal 12 will be clamped to $(V+V_D)$. Thus, a substantially increased voltage applied to terminal 93 as a pull-up voltage will be clamped to $(V+V_D)$ when a logical 0 is applied to terminal 11 and N channel transistor 23 is turned off and P channel transistor 22 is turned on. Furthermore, this forward biased condition oftentimes triggers a "latch up" phenomenon which causes a high power dissipation and often damages the device. This latch up phenomenon and a method of minimizing the possibility of latch up is described in a copending U.S. Patent Application of Chen, Ser. No. 338,778 filed Jan. 11, 1982 and assigned to Fairchild Camera and Instrument Corporation, the assignee of this invention, which is hereby incorporated by reference. Thus, the CMOS Push-Pull output buffer 20 is not suitable for use when it is desired to utilize an external pull-up resistor 95 in conjunction with an external pull-up voltage applied to terminal 93. When an external pull-up voltage is required, the open drain output buffer circuit 10 of FIG. 1a is utilized because, as previously discussed, parasitic diode 19 (FIG. 1a) is reverse-biased and does not provide unwanted clamping of the external voltage applied to terminal 12. The reverse-bias breakdown voltage of parasitic diode 19 is typically on the order of 40 volts, and thus does not breakdown with typical pull up voltages.

In many applications, a single integrated circuit device such as a microprocessor is required by one user to have an output buffer configuration wherein certain output leads are provided as open drain output buffers, and other output leads are provided as CMOS Push-Pull output buffers, and is required by another user to have a different configuration of output buffers. Accordingly, prior to my present invention, it was heretofore required under such certain circumstances to produce a large number of separate products, each performing the same function but designed and fabricated to have different output buffer configurations. Clearly, the requirement that a large number of separate products be designed and manufactured in order to provide customers with the desired type of output buffer configurations is expensive and requires either a large inventory of products in order to meet customers' demands in a timely manner or requires the customers to wait undesirably long times for their specific device, utilizing their required output buffer configuration, to be manufactured from raw silicon substrates.

To overcome this, programmable output buffer stages have been proposed. A schematic diagram of one form of a programmable output buffer stage is shown in FIG. 3. The programmable output buffer stage 30 of FIG. 3 is similar to the prior art CMOS Push-Pull output buffer stage 20 of FIG. 2a. However, programmable conductive link 173 is used to connect the source of P channel transistor 22 with the drain of N channel transistor 23, when programmable output buffer stage 30 is to be used as a CMOS Push-Pull output stage. Conversely, when programmable output stage 30 is to be used as an open drain output stage, conductive link 173 is not formed, thus electrically isolating P channel transistor 22 and thus causing P channel transistor 22 to have no effect in the operation of output stage 30. In this manner, output stage 30 functions as an open drain output buffer, with N channel transistor 23 performing the open drain output buffer function.

Conductive link 173 may be formed in one of several manners. For example, conductive link 173 may be formed as a fusible link which is destroyed by a programming current of sufficient magnitude to cause the fusible link to open. Thus, if programmable output buffer 30 is to utilized as CMOS Push-Pull output stage, fusible link 173 will be left intact. Conversely, when programmable output buffer 30 is to be used as an open drain output buffer, fusible link 173 will be opened by the passage of a large amount of current therethrough. A major disadvantage to using fusible links to program the output buffer is that the fusible links can be damaged by the unintentional connection of an output lead of the device to a voltage greater than or equal to the programming voltage. Thus, if a device output lead is accidentally shorted to an external voltage, the output buffer associated with that output lead will be programmed by the opening of its fusible link, thus providing an open drain output buffer where a CMOS Push-Pull output buffer is desired, thereby rendering the device useless. Accordingly, the use of fusible links is not a desirable method for programming output buffers.

In another programmable output buffer, conductive link 173 is formed (or omitted) during the formation of an interconnect pattern on the surface of the integrated circuit die. This interconnect pattern is either a metalized layer (typically aluminum or an alloy of aluminum), polycrystalline silicon, or a diffused region. Thus, when forming the interconnect pattern on the device conductive link 173 will be formed, thus electrically connecting the drain of P channel transistor 22 to the drain of N channel transistor 23, when output buffer 30 is to operate as CMOS Push-Pull output buffer. Conversely, during formation of the interconnect pattern on the surface of the die conductive link 173 will be omitted, thus not providing electrical connection between the drain of P channel transistor 22 and the drain of N channel transistor 23, when output buffer 30 is to function as an open drain output buffer. The use of the metal mask to program output buffer 30 is desirable in that the metal interconnects are formed in a rather late stage of the processing of an integrated circuit device. Furthermore, many devices in which this programmable output stage may be used include other components which are programmed by the metal interconnect mask. For example, some read only memories (ROMS) are programmed by appropriate design of the metal interconnect pattern. However, the use of the metal interconnect pattern to program the output buffer is undesirable when other devices, such as ROM cells, are not programmed by use of the metal interconnect pattern, in that two unique programming masks are required to program each device type—one mask to program the ROM cells and either the metal mask or the contact mask to program the output buffers. Modern integrated circuit fabrication techniques discourage the use of the metal interconnect patterns as the means for programming ROM cells in that a significant reduction in ROM cell size (and thus a consequent increase in ROM packing density) is achieved by utilizing ROM cells which are programmed by the selective introduction of dopants so as to form selected ROM cells as either enhancement devices or, alternatively, as depletion devices. The use of such ROM cells which are programmed by the selective introduction of dopants provides an approximately four-fold increase in packing density as compared with the so-called "contact" ROMs, in which ROM cells are programmed by the selective formation (or non-formation) of electrical contacts from a metal interconnect to the ROM cell. Similarly, the use of such ROM cells which are programmed by the selective introduction of dopants provides an approximately ten-fold increase in packing density over the so-called "metal mask" ROMs in which ROM cells are programmed by their selective connection (or non-connection) defined by a specific metal interconnect pattern designed to implement the ROM code. Accordingly, it is undesirable to design ROMs which are programmed by either the contact mask or the metal interconnect mask, and thus it is also undesirable to design output buffers which are programmed by either the contact mask or the metal interconnect mask.

In another structure, shown in the schematic diagram of FIG. 4a, the circuit of FIG. 2a is formed with the addition of N channel transistor 43 connected in series between the source of P channel transistor 22 and the drain of N channel transistor 23. In this manner, N channel transistor 43 acts as a switch. With a logical 0 (low voltage) applied to the control gate 44 of N channel transistor 43, N channel transistor 43 turns off, thus electrically disconnecting the drain of transistor 22 from the drain of transistor 23, thus causing programmable output buffer 40 to operate as an open drain output buffer. Conversely, with a logical 1 (high voltage) applied to the control gate 44 of N channel transistor 43, N channel transistor 43 conducts, thus connecting the drain of P channel transistor 22 to the drain of N channel transistor 23, thus causing programmable output buffer 40 (FIG. 4a) to function similarly to a CMOS Push-Pull output buffer. However, since the voltage V is typically the highest voltage available within the integrated circuit, with a logical 1 signal equal to V applied to gate 44 of N channel MOS transistor 43, the output voltage corresponding to a logical 1 (i.e. when P channel transistor 22 is on and N channel transistor 23 is off) will be equal to $(V - V_T)$, where $V_T$ is the threshold voltage of N channel transistor 43. This is undesirable because true CMOS Push-Pull output buffers are required to provide a logical 1 output signal corresponding to V. Furthermore, a P channel MOS transistor cannot be used in place of N channel MOS transistor 43 because of the previously described problem of having a parasitic PN diode connected between output terminal 12 and ground which becomes forward biased when the output buffer 40 is used as an open drain output buffer (i.e. P channel switch 43 is off) with an external pull-up.

SUMMARY

In accordance with this invention, a structure and method are provided wherein a single output buffer stage is provided which can be programmed to function either as an open drain output buffer or a CMOS Push-Pull output buffer. The output buffer stage constructed in accordance with this invention is programmed in one of several manners. In one embodiment of this invention, the fabrication steps utilized to program the output buffer are the enhancement and depletion dopings, whereby certain devices of the output buffer are programmed to either remain always turned off or always turned on, thus programming the output buffer to serve either as an open drain output buffer or as a CMOS push-pull output buffer.

BRIEF DESCRIPTION OF THE DRAWINGS

FIG. 1b is cross-sectional view of a semiconductor structure providing the circuit of FIG. 1a;

FIG. 2b is a cross-sectional view of a semiconductor device providing the circuit shown in FIG. 2a;

FIG. 4b is a cross-sectional view of one embodiment of a semiconductor structure which provides the circuit shown in FIG. 4a.

DETAILED DESCRIPTION

Figure 1A:
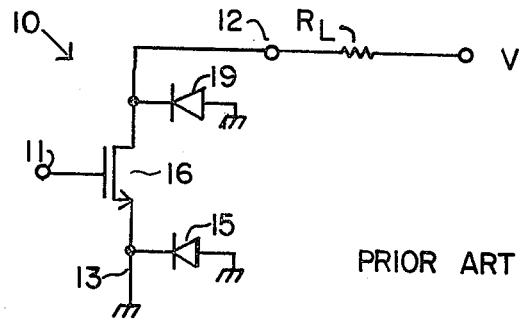
FIG. 1a is a schematic diagram of a prior art open drain output buffer stage.
Figure 1B:
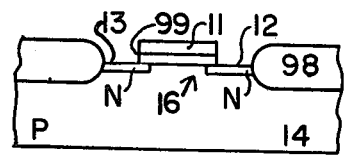
Figure 2A:
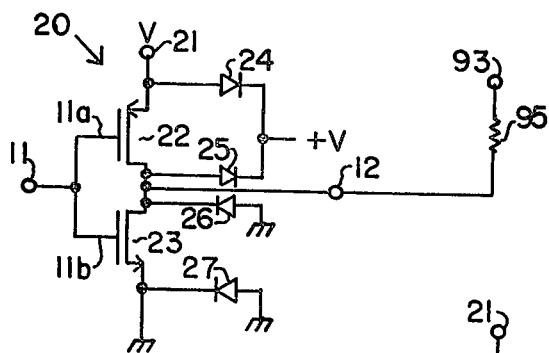
FIG. 2a is a schematic diagram of a prior art CMOS Push-Pull output buffer stage.
Figure 2B:
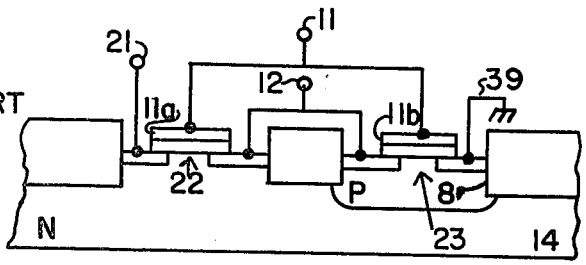
Figure 3:
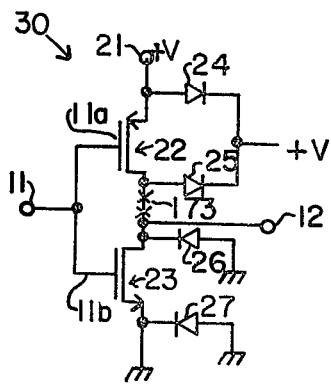
FIG. 3 is a schematic diagram of an output buffer stage constructed in accordance with one embodiment of my invention.
Figures 4A, 5:
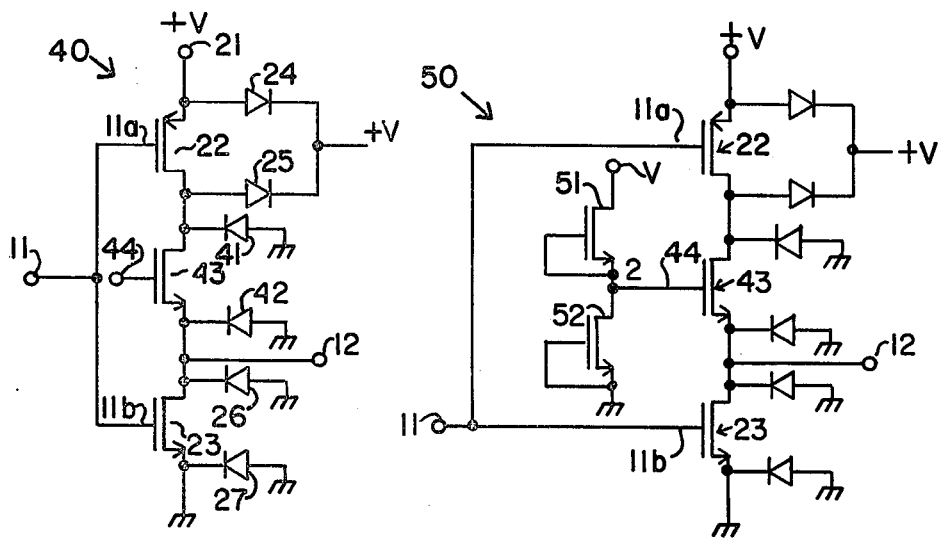
FIG. 4a is a schematic diagram of an output buffer stage constructed in accordance with another embodiment of my invention.
FIG. 5 is a schematic diagram of yet another embodiment of an output stage constructed in accordance with my invention.
Figure 4B:
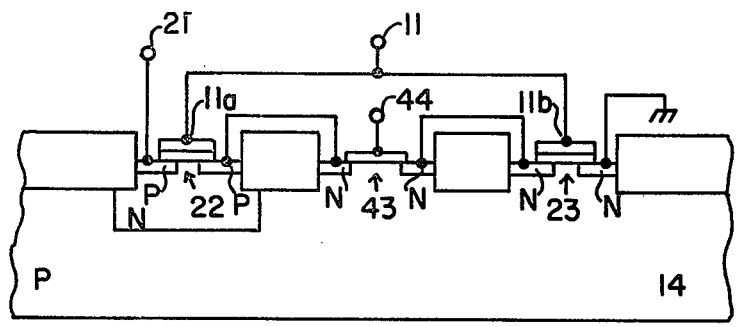

One embodiment of this invention is shown in the schematic diagram of FIG. 5. Programmable output buffer 50 shown in FIG. 5 is similar to the programmable output buffer 40 of FIG. 4a. However, in the embodiment shown in FIG. 5, transistors 51 and 52 are provided and which in turn provide the appropriate bias voltage to control gate 44 of N channel transistor 43 in order to program the output buffer 50 to operate either as a CMOS Push-Pull output buffer or, alternatively, as an open drain output buffer. In this embodiment, transistor 51 comprises an N channel device having its drain connected to a positive voltage supply (V in this case) and its gate and source connected in common with both the drain of N channel transistor 52 and the control gate 44 of N channel transistor 43. The control gate and source of transistor 52 are connected in common with ground. In the description to follow, the equivalent P channel embodiment of the bias circuit comprised of transistors 51 and 52 will be apparent by merely reversing the positive voltage supply and ground connections respectively for transistors 51 and 52.

The programmable output buffer is programmed to function as a CMOS Push-Pull output buffer in the following manner. During a first doping process, P channel transistor 22, N channel transistor 23, and N channel transistor 52 are formed as enhancement devices. N channel enhancement devices require a minimum positive threshold voltage to exist between their gate and source in order for the N channel enhancement transistor to turn on. Similarly, P channel enhancement transistors require a voltage equal to or more negative than its negative threshold voltage to exist between its gate and source in order for the P channel enhancement transistor to turn on. During the second doping step, N channel transistors 43 and 51 are formed as depletion devices. N channel depletion devices require a voltage greater than or equal to their negative threshold voltage to exist between their gate and source in order to turn on. Thus, with the gate and source of N channel depletion transistor 51 connected in common, their voltage difference is 0 which is above the negative threshold voltage of N channel depletion transistor 51. Thus, N channel depletion transistor 51 conducts. Similarly, with the control gate and source of N channel enhancement transistor 52 connected in common, their voltage difference is 0, which is less than the positive threshold voltage of N channel enhancement transistor 52, thus causing transistor 52 to remain off. In this manner, the positive voltage V is applied through conducting depletion transistor 51 to the control gate 44 of N channel depletion transistor 43. Because the voltage on output terminal 12 will never exceed V (because in this instance programmable output stage 50 is being utilized as a CMOS Push-Pull output stage) the voltage difference between the voltage V available on the control gate 44 of N channel depletion transistor 43 and the voltage available on the source of transistor 43, will never be less than 0, which is greater than the negative threshold voltage of depletion 43, thus causing transistor 43 to conduct. Thus, transistor 43 provides a low impedance path connecting the drain of P channel transistor 22 with the drain of N channel transistor 23, thus causing programmable output stage 50 to operate as a CMOS Push-Pull output buffer.

Conversely, programmable output buffer 50 is programmed to function as an open drain output buffer in the following manner. First, in one doping step, P channel transistor 22, N channel transistor 23, N channel transistor 43, and N channel transistor 51 are fabricated as enhancement devices. In a second doping step, N channel transistor 52 is formed as a depletion device. With N channel transistor 51 formed an enhancement device, and the voltage between its gate and source, which are connected in common, equal to zero, enhancement device 51 will remain off. Conversely, because N channel transistor 52 is formed as a depletion device and the voltage between its gate and source, which are connected in common, is zero, which is above its negative threshold voltage, depletion device 52 will remain on. With depletion device 52 on, the control gate 44 of N channel enhancement transistor 43 is effectively grounded. Thus, the voltage difference between control gate 44 and the source of transistor 43 will never be greater than the positive threshold voltage of enhancement transistor 43 and thus transistor 43 will remain off. With transistor 43 turned off, P channel transistor 22 is effectively disconnected, thus causing N channel transistor 23 to provide an open drain output buffer. Of importance, the external pull up voltage applied to output terminal 12 cannot exceed the source to drain breakdown voltage of N channel transistor 43, or transistor 43 will not function as an open switch, and output buffer 50 will not function properly. However, utilizing MOS semiconductor processing techniques well known to those of ordinary skill in the art, the source to drain breakdown voltage of N channel enhancement transistor 43 is on the order of 15 volts, which is well above the typical external pull up voltage that is applied to terminal 12 when output buffer 50 is used as an open drain output buffer.

This invention is suitable for use with any method for forming complementary metal oxide silicon (CMOS) devices, including prior art processes for forming CMOS devices which are well known to those of ordinary skill in the art. In one embodiment of this invention, the CMOS devices having a gate oxide thickness of approximately 650 Å are formed in an N type silicon substrate having crystal orientation (100) and resistivity of approximately 2-4 ohm-centimeters. A P type well region is formed within the N type substrate by the implantation of boron ions at approximately 100 KEV to a dosage of approximately $7 \times 10^{12}$ atoms/cm$^2$ and driven by an oxidation in dry oxygen at approximately 1150° C. for approximately 500 minutes. Arsenic ions are selectively implanted at approximately 100 KEV to a dosage of approximately $3 \times 10^{12}$ atoms/cm$^2$ into the to-be-formed N type channel regions of the to-be-formed N channel depletion transistors, thus providing an N channel depletion device threshold voltage of approximately $-5$ volts. P channel threshold voltage adjustment is performed by the ion implantation of boron ions at approximately 40 KEV to a dosage of approximately $2 \times 10^{11}$ atoms/cm$^2$, thus providing a P channel threshold voltage of approximately $-0.8$ volts. N+ source/drain regions are then formed in the P well by the implantation of arsenic ions at approximately 40 KEV to a dosage of approximately $5 \times 10^{15}$ atoms/cm$^2$. The N+ source/drain regions are then driven by the formation of a layer of oxide covering the N+ source/drain regions which is formed by thermal oxidation in dry oxygen at a temperature of approximately 1000° C. for approximately 40 minutes. P+ source/drain regions are then formed in the N type substrate by the ion implantation of boron ions at approximately 30 KEV to a dosage of approximately $5 \times 10^{15}$ atoms/cm$^2$. This technique provides N channel and P channel enhancement transistors having threshold voltages of approximately $+0.8$ volts and $-0.8$ volts, respectively, as well as N channel depletion transistors which have a threshold voltage of approximately $-5.0$ volts.

While specific embodiments of my invention have been described in this specification, these embodiments serve as illustrations only and not as limitations on the scope of my invention. Numerous other embodiments of my invention will become readily apparent to those of ordinary skill in the art in light of the teachings of this specification.

I claim:

1. An output buffer circuit comprising:
   a first P channel MOS transistor having a drain connected to a first potential, a gate connected to an input control signal, and a source;
   a first N channel MOS transistor having a drain, a gate connected to said input control signal, and a source connected to a reference potential;
   an output node connected to said drain of said first N channel MOS transistor;
   a second N channel MOS transistor having a drain connected to said source of said first P channel MOS transistor, a source connected to said drain of said first N channel MOS transistor, and a gate connected to a programming terminal for receiving a programming voltage;
   wherein a low programming voltage causes said second N channel MOS transistor to turn off, and thus when said input control signal is high, said first P channel transistor is off, said first N channel transistor is on, said output node has a potential substantially equal to said reference potential, thus providing a logical zero output signal; and thus when said input control signal is low, said first N channel transistor is off, said second N channel transistor is off, and said output node is isolated from said first potential and from said reference potential;

and
   wherein a high programming voltage causes said second N channel transistor to turn on, and thus, when said input control signal is high, said first N channel MOS transistor is on, said first P channel MOS transistor is off, and thus said output node is thereby connected to said reference potential thus providing a logical zero output signal; conversely, when said input control signal is low, said first N channel MOS transistor is off, said first P channel MOS transistor is on, thus said output node is thereby connected to said first potential, thus providing a logical one output signal.

2. The circuit as in claim 1 wherein said programming voltage is provided by a programming circuit comprising:
   a third N channel MOS transistor having a drain connected to said first potential, and a gate and a source connected in common to said gate of said second N channel MOS transistor;
   a fourth N channel MOS transistor having a drain connected to said gate of said second N channel MOS transistor, and a gate and a source connected in common to said reference potential;
   wherein said second and third N channel MOS transistors are formed as enhancement-type devices and said fourth N channel MOS transistor is formed as a depletion-type device when said programming voltage is to be low;

and
   wherein said second and third N channel MOS transistors are formed as depletion-type devices and said fourth N channel MOS transistor is formed as an enhancement-type device when said programming voltage is to be high.

3. The circuit as in claim 1 wherein said programming voltage is provided by a programming circuit comprising:
- a second P channel MOS transistor having a source and a gate connected in common to said first potential, and a drain connected to said gate of said second N channel MOS transistor;
- a third P channel MOS transistor having a source and a gate connected in common to said gate of said second N channel MOS transistor, and a drain connected to said reference potential;
- wherein said second N channel MOS transistor and said second P channel MOS transistor are formed as enhancement-type devices and said third P channel MOS transistor is formed as a depletion-type device when said programming voltage is to be low; and
- wherein said second N channel MOS transistor and said second P channel MOS transistor are to be formed as depletion-type devices and said third P channel MOS transistor is to be formed as an enhancement-type device when said programming voltage is to be high.

* * * * *